United States Patent [19]

Yamaguchi et al.

[11] Patent Number: 4,630,093
[45] Date of Patent: Dec. 16, 1986

[54] WAFER OF SEMICONDUCTORS

[75] Inventors: Jun Yamaguchi; Osamu Shikatani, both of Hyogo, Japan

[73] Assignee: Sumitomo Electric Industries, Ltd., Osaka, Japan

[21] Appl. No.: 673,400

[22] Filed: Nov. 20, 1984

[30] Foreign Application Priority Data

Nov. 24, 1983 [JP] Japan .................. 58-181254[U]

[51] Int. Cl.$^4$ ............................................. H01L 29/06
[52] U.S. Cl. ........................ 357/55; 148/DIG. 161
[58] Field of Search ............................ 357/55, 40; 148/DIG. 161

[56] References Cited

U.S. PATENT DOCUMENTS

3,925,807 12/1975 Sonntag ............................. 357/55

FOREIGN PATENT DOCUMENTS

58-25039 of 1983 Japan ................................. 357/55
58-23430 2/1983 Japan ................................. 357/55
58-103144 7/1983 Japan ................................. 357/55

*Primary Examiner*—J. Carroll
*Attorney, Agent, or Firm*—Cushman, Darby and Cushman

[57] ABSTRACT

Identification of the front surface and whether the front surface has a mesa direction for wafers of compound semiconductors belonging to group III-V have a crystalline structure of the zinc blende type. The wafer has asymmetric peripheral edge with regard to a middle plane to denote the front surface. Another asymmetry as well as the edge asymmetry determines the front surface and the mesa direction on the surface. The other asymmetry is an orientation flat in a circular wafer. The asymmetry of the peripheral edge is given by the half round whose curvature changes in the direction of the thickness, two slanting parts whose lengths are different or a slanting part or a perpendicular part which are formed in succession in the direction of the thickness on the peripheral edge and so on.

4 Claims, 10 Drawing Figures

WAFER OF SEMICONDUCTORS

BACKGROUND OF THE INVENTION

This invention relates to wafers of single crystal compound semiconductors belonging to groups III-V.

Compound semiconductors belonging to groups III-V comprise, for example, GaAs, GaP, InP, InAs and GaSb. Compound semiconductors of this type are used in various devices, such as for example, light emitting devices, light sensitive devices and high-speed operational devices.

It is very important in a manufacturing process to be able to distinguish the front and rear surfaces of a compound semiconductor wafer. Therefore an arrangement which enables one to distinguish these surfaces from one another is highly desirable.

An ingot of a single crystal of compound semiconductor of groups III-V is grown by a pulling method or a boat method. The single-crystal ingot is then sliced into many thin wafers. The sliced wafers are polished on one or both surfaces. On a wafer many active electronic devices may be formed by a sequence of steps. Then, the processed wafer is scribed and cut many times vertically and horizontally into many small chips each individual chip being an electronic device unit.

These compound semiconductors have a crystalline structure of zinc blende type (ZnS), which belongs to cubic system on crystallography. The crystalline point group is denoted by $\bar{4}\,3\,m$. The crystalline point group does not have four-fold symmetry, i.e. the front surface of the wafer sliced from the crystalline ingot is not identical with the rear surface. When electronic devices are formed on a wafer of the compound semiconductor, it is important to be able to distinguish which surface is the true front surface and which is the mesa-direction on the front surface.

Cleavage planes are generally denoted by (110) planes. The numerals 0 or 1 in the round parentheses are known as the plane index. The general representation includes all planes which can be obtained by the symmetry operations of the point group starting from a (110) plane.

For example, on the wafer whose front surface is denoted by the (100) plane, the cleavage planes are four planes (011), (0$\bar{1}$1), (01$\bar{1}$) and (0$\bar{1}\bar{1}$) which meet at right angles with the front surface of the wafer. The upper line drawn upon a numeral signifies a minus sign in crystallography.

In case of the wafer in which the front surface is the (100) plane, a cleavage plane is parallel with a perpendicular defined on the front surface. A small bow-shaped part can be cut off from a circular wafer along a cleavage plane. The cord generated by cutting off the bow-shaped part, which is parallel with one of the four cleavage planes, denotes a crystallographic direction. Thus the cord is called as an "orientation flat".

The orientation flat designates one of four cleavage planes. However, in the case of a compound semiconductor, a single orientation flat is insufficient to identify the crystallographic direction, because the crystal of the compound semiconductors lacks four-fold symmetry and the line <100> is a four-fold-width-inversion symmetry axis. The crooked parentheses denotes a crystallographic line, which is perpendicular to a plane signified by the same numerals bracketed by a set of round parentheses.

Among the four cleavage planes which are perpendicular to the surface of a (100) wafer, two cleavage planes which are parallel to one another are equivalent. But, two cleavage planes which are perpendicular to each other are unequivalent.

Two different kinds of cleavage planes must be clearly distinguished. It is inappropriate to make any electronic devices on a wafer without knowing which direction is the mesa-direction. The term "mesa-direction" will now be clarified.

When the surface of a wafer is etched by a proper etchant along the cleavage planes, the sectional shape etched along a cleavage plane becomes a normal trapezoid whose bottom is wider than the top. But the sectional shape etched along another cleavage plane becomes a reversed trapezoid whose bottom is narrower than top. The former section etched is called "mesa", and the latter section is called "reverse-mesa".

The etching process to check the mesa direction will now be briefly explained. Photoresist solution is painted on a wafer to be examined. A mask plate having a rectangular transparent part (or opaque part) is put on the resist-painted wafer, the sides of the rectangle of the mask coinciding with the cleavage planes of the crystalline wafer. The masked wafer is then exposed by a light and the wafer is developed.

A small rectangular resist layer stays on the wafer surface. Then the wafer is etched in an appropriate etchant. The wafer surface is gradually etched except for the rectangular part covered by the photoresist layer. The sectional shapes of the periphery of the rectangular part are significant.

Two parallel sides of the four sides of the rectangular part have a sectional shape like a normal trapezoid with a wider bottom. Another two parallel sides which are perpendicular to the first mentioned sides have a sectional shape like a reverse trapezoid with narrower bottom. The former sectional shape is called "mesa". The latter sectional shape is called "reverse-mesa".

In the etching process, the photoresist layer has four sides parallel with the cleavage planes (0 ±1 ±1). In the vicinity of the four sides of the photoresist layer etching makes progress along intermediate angles held between the (100) and (0±1 ±1) planes. Therefore equivalent-progress-etching-planes are four planes denoted by the plane symbol (1 ±1 ±1).

If the same etching process is executed also upon the rear surface of the wafer, the equivalent-progress-etching-planes are eight planes denoted by (±1 ±1 ±1).

"l", "m" and "n" signify either of the two integers +1 and −1. We consider how the (l m n) plane is converted by the symmetry operations of $\bar{4}\,3\,m$. An assembly of planes which are converted by the operations into another planes belonging to the same assembly forms an independent group of the planes.

The crystalline point group notation $\bar{4}\,3\,m$ is shortly explained. "$\bar{4}$" signifies four-fold-width-inversion symmetry. The rotation axes are <±100>, <00 ±1> and <0 ±10>. The n-fold symmetry means the rotation of 360/n degrees around some pertinent axis does not change the crystal structure. "3" signifies three-fold symmetry around <111>, <$\bar{1}$11>, .... axes. "m" signifies the mirror symmetry with regard to (110), (01$\bar{1}$), ... planes.

The eight planes denoted by (lmn) can be classified into two groups, in which the plane indices satisfy the equations (i) l m n = 1

(ii) l m n = −1

We designate the front surface of wafer as (100) and the rear surface as ($\bar{1}$00). However the designation to which surface the minus sign is attributed is an alternative. By determining the notation of another two axes beside the designation of front or rear surface, the distinction between the two groups (i) and (ii) of planes are done with a definite meaning.

In the etching process, the etching planes are represented by (1 ±1 ±1), because the etching was done along the periphery of a small rectangular part having four sides parallel with the cleavage planes.

According to the mentioned classification of (i) and (ii), (111) plane is equivalent with (1$\bar{1}\bar{1}$) plane, and (1$\bar{1}$1) plane is equivalent with (11$\bar{1}$) plane. But (111) plane is unequivalent of (1$\bar{1}$1) plane.

Because two groups of planes are unequivalent, the etching speeds on the two group of planes are reasonably different, where the etching speed is faster, the etched part is likely to be a reverse-mesa shape. Where the etching speed is slower, the etched part becomes a mesa shape. Therefore distinction between mesa and reverse-mesa directions becomes clear. The mesa direction is a well defined direction on a surface. The reverse-mesa direction is also a well-defined direction on it.

If (111) plane and (1$\bar{1}\bar{1}$) plane form a mesa shape, (1$\bar{1}$1) plane and (11$\bar{1}$) plane form a reverse-mesa shape.

If we project the crystallographical directions on the surface of the wafer, the projected mesa direction is denoted by a line. The projected reverse-mesa direction is also denoted by a line which is perpendicular to the projected mesa direction.

FIG. 6 is a schematic perspective view of a wafer more clearly showing the mesa directions and reverse-mesa directions on both surfaces. The wafer, as shown, is in a state after etching.

The rectangular portion covered by the photoresist is not etched away but remains on the surfaces. The sides of the rectangular portion are parallel with the cleavage planes.

Around the periphery of the photoresist layer, the edge parts on the mesa direction M are etched in a shape with a wide bottom and a narrow top. On the contrary the edge parts on the reverse-mesa directions R are etched in a shape with a narrow bottom and a wide top. The projected reverse-mesa direction on the surface is perpendicular to the mesa direction.

To facilitate the understanding of the etching shape slant broken lines are drawn in the bottom portions of the photoresist-covered layer at the same level of other surface part.

If the photoresist layer F is a square, the bottom portion of the photoresist-covered layer is a rectangle which is longer in the mesa direction and shorter in the reverse-mesa direction.

As FIG. 6 clearly shows, in the rear surface of the wafer the mesa direction and the reverse-mesa direction are inverted. The mesa direction projected on the rear surface which a dotted R denotes is parallel with the reverse-mesa direction M projected on the front surface. The wafer is sliced in (100) plane. If we assume l = 1 on the front surface, l = −1 on the rear surface.

On the front surface, <111> and <1$\bar{1}\bar{1}$> are mesa directions. Therefore on the rear surface, <$\bar{1}$11> and <$\bar{1}\bar{1}$1> are mesa directions.

The projected mesa directions M on the front surface are <011> and <0$\bar{1}\bar{1}$>. The projected reverse-mesa direction R thereon are <0$\bar{1}$1> and <01$\bar{1}$>.

The projected mesa directions M on the rear surfaces are <0$\bar{1}$1> and <01$\bar{1}$>. The projected reverse-mesa direction R on the rear surface are <011> and <0$\bar{1}\bar{1}$>.

It is an important feature of group III–V semiconductors that the projected mesa direction and reverse-mesa direction are inverted on both surfaces. This is because the compound semiconductors have the crystalline structure of the zinc blende (ZnS) type. In a unit cell of lattice structure group III atoms form a first face-centered cubic sub-lattice. Thus a denotes a lattice constant. Three dimensional coordinates x,y,z are defined on a lattice. The positions of the group III atoms are (±a/2,0,0), (0, ±a/2,0), (0,0,±a/2) and (±a/2, ±a/2, ±a/2). In the same coordinates group V atoms form a second face-centered cubic sub-lattice which deviate from the group III atoms' sub-lattice by (a/4,a/4,a/4). Thus the positions of group V atoms are (la/4, ma/4, na/4), where the product l m n is either 1 or −1. As group V atoms are not identical to group III atoms, two face-centered cubic sub-lattices are distinguishable.

The crystalline structure of silicon (Si) is a diamond type, which is akin to the zinc blend type except the clear distinction of group III and group V atoms.

If we replace both group III atoms and group V atoms of Si atoms, we obtain the crystalline structure of silicon. In the case of Si the first sub-lattice and the second sub-lattice which deviates (a/4,a/4,a/4) from the first sub-lattice are totally equivalent, because both sub-lattices are formed only with silicon atoms.

In a group III and V semiconductor a group III atom is connected with the nearest four group V atoms by covalent bonds. The vector representations of the four covalent bonds are denoted by (la/4,ma/4,na/4), where l, m and n are +1 or −1, and the product l m n is either 1 or −1.

If the product l m n is +1 for four vectors projected from a group III atom, the another product l m n must be −1 for four vectors projected from a group V atom. Thus mesa direction differs from the reverse-mesa direction in group III–V semiconductor.

However in crystalline silicon, two sub-lattices are equivalent, because all the lattice sites are occupied by Si atoms. The vector represntation (la/4,ma/4,na/4) are applicable to both equivalent sub-lattices in which the product l m n is either 1 or −1. Thus the mesa direction coincides to the reverse-mesa direction. And cleavage plane is denoted by (111). Thus in the case of silicon semiconductor even concepts of mesa direction don't exist. All cleavage planes in crystalline silicon are totally equivalent.

The reason why we must distinguish the mesa direction and the reverse-mesa direction on a surface on compound semiconductor will now be explained.

Epitaxy, impurity doping, etching, evaporation coating and other wafer processes are carried out on a wafer for producing FETs or other electronic devices. When some parts of a front surface of a wafer are etched to make electrodes by evaporation coating process, the electrodes must be formed to cover the step parts generated by the former etching process.

If the step part is a slant edge on the mesa direction, the electrode is well formed on the step part, because thin electrode layer coats on a gently sloping area of the surface.

However, if an electrode might be formed on a reverse-mesa edge which has a bottom part narrower than a top part, the electrode layer does not contact on the edge tightly.

Hence metallic electrodes must be formed on the slant edge etched in the mesa shape. This is one reason why the mesa direction on a wafer should be clarified. There are additional reasons why we must distinguish mesa direction or reverse-mesa direction on a front surface of a wafer. But further explanation of the reasons is omitted, because it is not the purpose of the invention.

In order to designate the crystallographical directions, not only the cleavage planes but also the mesa direction should be denoted. Conventional designation of the directions on a compound semiconductor wafer uses two distinguishable orientation flats with different lengths which are perpendicular with each other.

Two orientation flats are shaped by cutting the (100) wafer periphery along the cleavage planes, that is (011) or (01$\bar{1}$) plane, and (0$\bar{1}$1) or (01$\bar{1}$) plane.

Both orientation flats coincide with the cleavage planes, but either main-orientation flat or sub-orientation flat is formed along the mesa direction. Because the lengths of the orientation flats differ from one another, the two orientation flats are distinguishable.

By a glimpse of two orientation flats on a wafer periphery, we can discern which are the cleave directions, which side of the wafer is the front surface, and which is the mesa direction on the front surface.

The conventional designation method of compound semiconductor wafers has some disadvantages. Although the lengths of the orientation flats are different, two orientation flats cannot easily be distinguished.

A practical rule should be described to discern the front surface or determine the mesa direction on the surface. For example, the rule is that if a wafer is positioned in a state wherein the main orientation flat is at the bottom and the sub-orientation flat is on the right side, the surface facing to the operator is the front surface.

Unskillful operators are apt to confuse two orientation flats, because it is difficult to determine the length of cords formed on a periphery of a circle by eye measurement. In addition, the rule to determine the front surface is rather complicated for them.

SUMMARY OF THE INVENTION

This invention relates to a semiconductor wafer whose front surface and mesa direction are easily determined even by unskillful operators by an asymmetrical shape of the peripheral edge. Instead of two orientation flats this invention provides a semiconductor wafer of group III–V compound in which one orientation flat and an asymmetry of the periphery designate which surface is the front end and which direction is the mesa direction in case of a circular wafer.

Compound semiconductor wafers are about 350 $\mu$m to 650 $\mu$m thick. The side edge of a conventional wafer is perpendicular to the front and the rear surface.

We define a "middle plane" which is parallel with both surfaces and lies at the same distance from the both surfaces.

Conventional wafers are symmetric with regard to the middle plane. Thus the middle plane was known as the "mirror" plane in conventional wafers.

It was widely thought that the reason why we cannot easily distinguish the front or rear surface is because the wafers are symmetric with respect to the middle plane in the direction of the perpendicular line upon the surfaces.

If a wafer should be asymmetric with respect to the middle line, one could easily deterine the direction of surfaces without uncertainty by looking at the wafer edge.

DETAILED DESCRIPTION OF THE PREFERRED EMBODIMENTS

Compound semiconductor wafers are about 30 mm to 80 mm in diameter and about 350$\mu$ to 650 $\mu$m in thickness. Thus the ratio of thickness to diameter ranges from about one two-hundredth to one fiftieth. If the sectional view of a wafer was depicted in proportion to the actual sizes, the fine shape of the peripheral edge would not be clear. Thus in the sectional views of wafers the direction of thickness—perpendicular to surfaces—is exaggerated to demonstrate the shape of peripheral edges.

A wafer (1) is a compound semiconductor wafer with a circular peripheral edge (2). An orientation flat (3) is marked on peripheral edge (2) by cutting a cord parallel with a cleavage plane.

Unlike conventional wafers peripheral edge (2) is ground in half round in the direction of thickness. The curvatures of the ground edge are different in the vicinities of the front surface U and the rear surface W, respectively. In this example the partial round $Q_1$ near the rear surface W has a smaller curvature. Curvature is defined as a reciprocal of curvature radius.

Thus the edge is ground more widely near the rear surface W. This wafer is asymmetric with respect to the middle plane XY. When an operator looks at the asymmetric peripheral edge, he understands which is the front surface of the wafer.

This wafer has the orientation flat OF (3) in the peripheral edge. The operator knows the front surface and the mesa direction from the orientation flat (3) and the asymmetry of the peripheral edge (2).

For example, a simple rule may be prescribed that the larger curvature $Q_1$ of the peripheral edge (2) should correspond to the front surface U and the orientation flat (3) should be the mesa direction thereon. This invention requires only an asymmetric shape of the peripheral edge (2). The shape of the edge (2) need not be half round.

Figure 3:
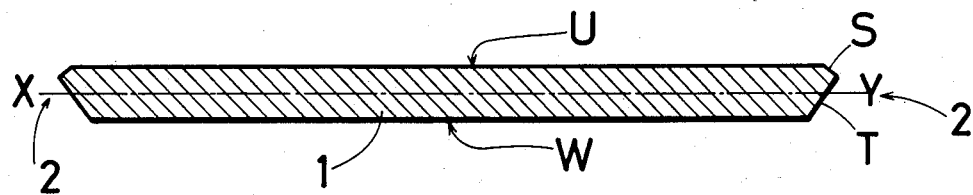
FIG. 3 is a sectional view of a semiconductor wafer according to a second embodiment of the invention.

FIG. 3 shows another embodiment of the invention. The peripheral edge (2) of the second examples has two slant parts S and T which are asymmetric with respect to the middle plane.

The width of the first slant part S in narrower than that of the second slant part T. The inequality of the widths of the slant parts enables us to distinguish the front surface of the water.

This invention is applicable not only to circular wafers but also to rectangular wafers.

Figure 4:
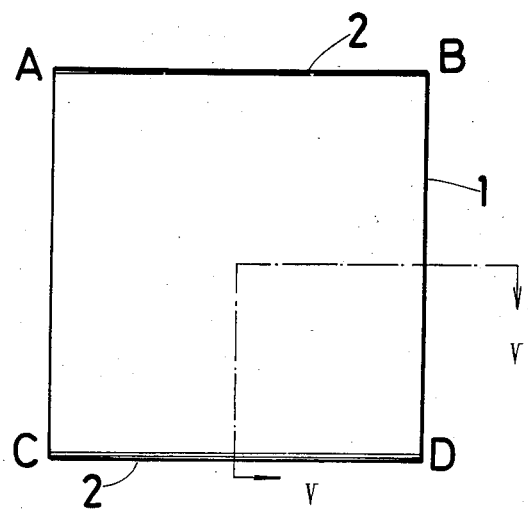
FIG. 4 is a plan view of a square semiconductor wafer according to a third embodiment of the invention.

FIG. 4 shows a square wafer as another embodiment. Four corners of the square are designated by A,B,C and D.

Among the peripheral edge (2), two sides AB and CD are shaped in an asymmetric half round ($Q_1$ and $Q_2$). But another sides AC and BD are flat. The asymmetry of the sides AB and CD enables us to know the front surface. But the asymmetry cannot teach us the mesa direction thereon, because all four sides AB, BD, DC and AC are cleavage planes.

Figure 5:
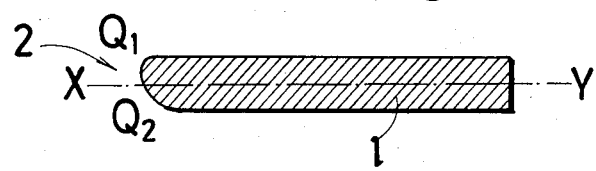
FIG. 5 is a sectional view taken along a crooked line V—V in FIG. 4.

Further asymmetry is required to signify the mesa direction. The additional asymmetry is given by the discrimination of ground sides and unground sides of the square wafer. The sides AB and CD are ground asymmetrically, but the sides AC and BD are unground as clearly shown in FIG. 5.

For example, a simple rule may be prescribed that the larger curvature $Q_1$ should correspond to the front surface and the ground sides should be parallel with the mesa direction on the front surface.

Although the square wafer requires the asymmetric sides which are either unground or ground, it needs no orientation flat, because all the four sides are parallel with the cleavage planes.

As wafers have less degrees of symmetry, less asymmetric are sufficient to determine the crystallographical directions of the wafers.

Figure 1:
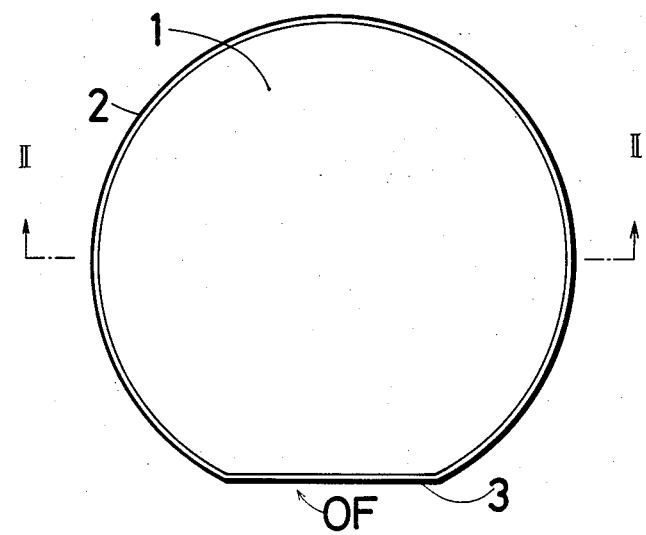
FIG. 1 is a plan view of a circular semiconductor wafer according to a first embodiment of the invention.

Circular wafers as shown in FIG. 1 have the highest symmetry. They are invariable by any rotation around a center perpendicular axis. Therefore both orientation flat and asymmetry of the peripheral edge are required to determine the crystallographical directions.

Square wafers as shown in FIG. 4 have the next highest symmetry. They have four-fold symmetry. They need no orientation flats, but need asymmetric sides which are ground or unground. Square is a special form of rectangle, in which all sides have the same length.

General rectangular wafers have two longer sides and two shorter sides. They have only two-fold symmetry. The shape is asymmetric by itself. The distinction of the longer or shorter sides is a powerful means to determine the crystallographical directions. Therefore, by grinding an asymmetric shape of the periphery the front surface and the mesa direction are determined.

In case of square wafers the asymmetrically-ground edge must have another asymmetry by itself. Among four side edges one to three side edges should be asymmetrically ground, but the remaining side edges should be normal edges. The asymmetry of the ground edge shows which is the front side of the wafer. Another asymmetry of the disposition of the ground edges teaches the mesa direction on the front surface.

In case of rectangular wafers another asymmetry than the ground edge does not required. Thus one to four side edges ground asymmetrically can decide the front surface and the mesa direction.

Figure 7:
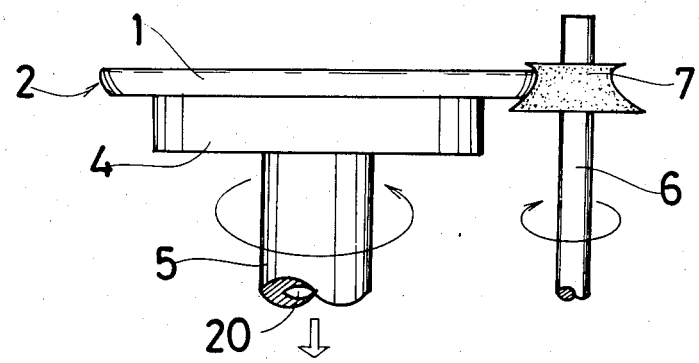
FIG. 7 is a front view of an example of a device to shape the asymmetrical edge of a wafer.
Figure 6:
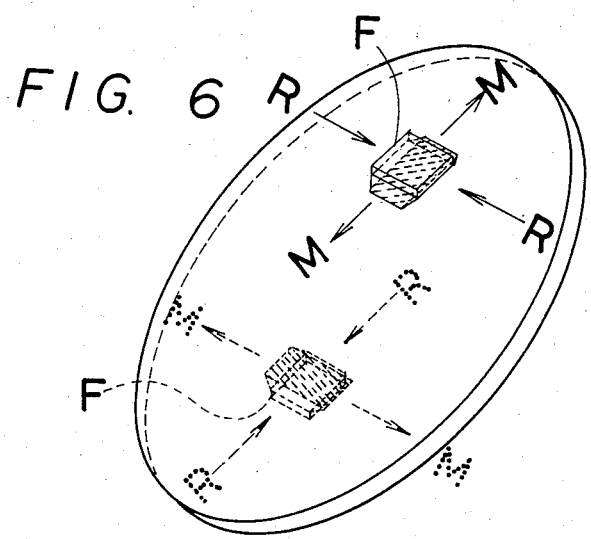
FIG. 6 is a schematical, perspective view of a semiconductor wafer etched without the square part covered by the photoresist layer, for more clearly showing the mesa direction and the reverse-mesa direction.

The method of formation of the asymmetric shape of the peripheral edge of wafer will now be briefly explained. FIG. 7 shows an example of the device for grinding the edge of a wafer.

A wafer (1) is fixed on a turn table (4) by a vacuum-chuck device. The wafer (1) may be a circular wafer with an orientation flat, a square wafer, or a rectangular wafer. The turn table (4) is supported by a rotary shaft (5), through which a conduit (20) is formed. Air is inhaled through the conduit (20) to fix the wafer (1) on the turn table (4).

Rotary shaft (5) rotates. With the peripheral edge (2) of the wafer (1) a rolling whetstone (7) contacts. The rolling whetstone (7) is fixed upon the rotary whetstone shaft (6). The rolling whetstone (7) rotates faster than the wafer (1).

Figure 2:
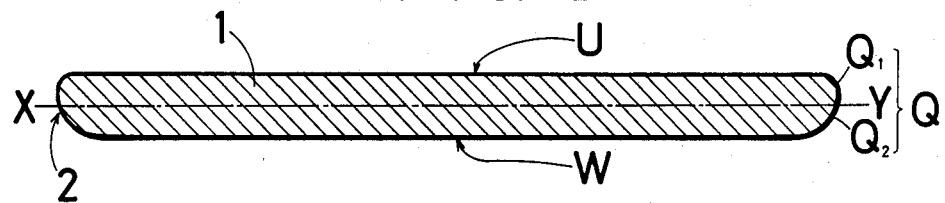
FIG. 2 is a sectional view taken along a line II—II in FIG. 1.

Wafer (1) and the whetstone (7) rotate counterclockwise. If the wafer (1) rotates clockwise. The rolling whetstone (7) has an asymmetric shape. Therefore the rolling whetstone (7) grinds the peripheral edge (2) of the wafer (1) into an asymmetric form as shown in FIG. 2. By choosing the shape of the whetstone any shape of peripheral edge (2) is easily formed.

Figure 10:
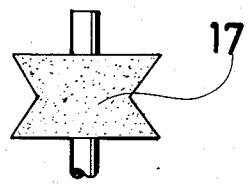
FIG. 10 is a front view of a rotary whetstone for shaping the asymmetrical edge shown in FIG. 3.

In order to form the peripheral edge (2) into the asymmetrical shape as shown in FIG. 3, another rolling whetstone (17) shown in FIG. 10 is available. Although the whetstone (17) deviates from the middle plane XY of the wafer (1).

After grinding the peripheral edge (1) of a wafer (1), operator etches the wafer (1) and polishes one side or both sides of the wafer (1).

To make electronic devices upon the wafer, various wafer processes are done, for example, vapor phase epitaxy, liquid phase epitaxy, ion plantation, photoresist-coating, etching, electrode-vapor-coating and so on.

Figure 8:
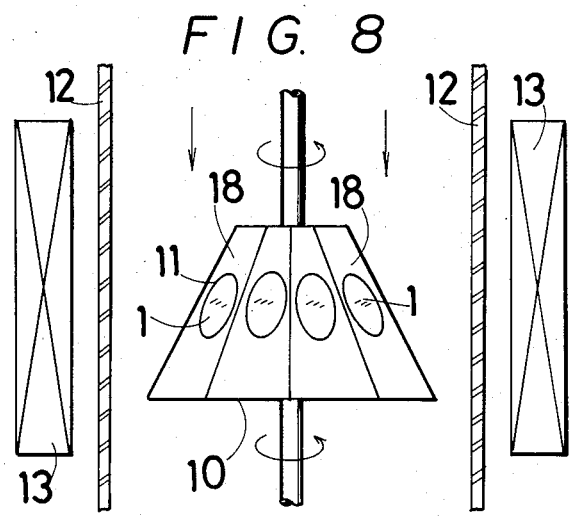
FIG. 8 is a schematical front view of an apparatus for a vapor epitaxy.
Figure 9:
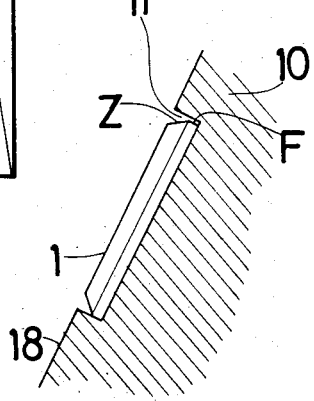
FIG. 9 is a sectional, partial view of the wafer and the susceptor holding the wafer in its cavity.

FIG. 8 shows an apparatus for a vapor phase epitaxy. A conical susceptor (10) is supported in a chamber (12). The conical susceptor (10) has six or eight slant planes (18).

Other embodiments and modification of the present invention will be apparent to those of ordinary skill in the art having the benefit of the teaching presented in the foregoing description and drawings. It is therefore, to be understood that this invention is not to be unduly limited and such modifications are intended to be included within the scope of the appended claims.

What is claimed is:

1. A semiconductor wafer comprising:
a group III–V compound crystal having a front and rear surface and an asymmetric peripheral edge, said edge being asymmetric with regard to a middle plane parallel to and equidistant from said front surface and said rear surface, wherein the structure of said wafer permits easy determination of said front surface.

2. A semiconductor wafer comprising:
a group III–V compound crystal having generally circular front and rear surfaces with an orientation flat along a cleavage plane of the crystal and an asymmetric peripheral edge, said edge being asymmetric with regard to a middle plane parallel to and equidistant from said front surface and said rear surface, wherein the structure of said wafer permits easy determination of said front surface and the mesa direction on said front surface.

3. A semiconductor wafer comprising:
a group III-V compound crystal having generally square front and rear surfaces with one to three asymmetric peripheral edges, said edges being asymmetric with regard to a middle plane parallel to and equidistant from said front surface and said rear surface, wherein the structure of said wafer permits easy determination of said front surface and the mesa direction on said front surface.

4. A semiconductor wafer comprising:
a group III-V compound crystal having rectangular front and rear surfaces with one to four asymmetric peripheral edges, said edges being asymmetric with regard to a middle plane parallel to and equidistant from said front surface and said rear surface, wherein the structure of said wafer permits easy determination of said front surface and the mesa direction on said front surface.

* * * * *